United States Patent [19]

Maruyama et al.

[11] Patent Number: 5,482,645

[45] Date of Patent: Jan. 9, 1996

[54] NON-OZONE DEPLETING CLEANING COMPOSITION FOR DEGREASING AND DEFLUXING PURPOSES

[75] Inventors: Akihiro Maruyama, Chiba, Japan; Björn Bergenstähl, Sundbyberg, Sweden; Eric Van de Hoek, Sliedrecht, Netherlands

[73] Assignee: Purac Biochem B.V., Gorinchem, Netherlands

[21] Appl. No.: 226,086

[22] Filed: Apr. 11, 1994

[30] Foreign Application Priority Data

Apr. 9, 1993 [JP] Japan .................... 5-107284
Feb. 8, 1994 [EP] European Pat. Off. ........... 94200235

[51] Int. Cl.⁶ .............. C11D 3/20; C11D 3/43; C11D 7/26; C23G 5/032
[52] U.S. Cl. .............. 252/170; 134/40; 252/153; 252/162; 252/174.17; 252/174.21; 252/364; 252/544
[58] Field of Search ............ 252/162, 170, 252/174.21, 364, 153, 544, 174.17; 134/40

[56] References Cited

U.S. PATENT DOCUMENTS

| 3,098,795 | 7/1963 | Kreps | 167/90 |
|---|---|---|---|
| 4,442,303 | 4/1984 | Mims | 560/191 |
| 5,002,680 | 3/1991 | Schmidt et al. | 252/90 |
| 5,059,241 | 10/1991 | Young | 71/106 |
| 5,210,296 | 5/1993 | Cockrem et al. | 562/589 |
| 5,221,362 | 6/1993 | Porta et al. | 134/40 |
| 5,294,263 | 3/1994 | Riso | 252/170 |

FOREIGN PATENT DOCUMENTS

| 62-255406 | 11/1987 | Japan . |
|---|---|---|
| 3-37299 | 2/1991 | Japan . |
| 3-037299 | 2/1991 | Japan . |
| 4-68088 | 3/1992 | Japan . |
| 4-068088 | 3/1992 | Japan . |
| 4-065500 | 3/1992 | Japan . |
| 4-065498 | 3/1992 | Japan . |
| 4-323299 | 11/1992 | Japan . |
| 5-098297 | 4/1993 | Japan . |
| WO90/08206 | 7/1990 | WIPO . |
| WO92/20835 | 11/1992 | WIPO . |

OTHER PUBLICATIONS

Chemical Abstract No. 59:4972f Sep. 1963, Abstract of FR Patent 1,322,336 Mar. 29, 1963.

*Primary Examiner*—Linda Skaling Therkorn
*Attorney, Agent, or Firm*—Young & Thompson

[57] ABSTRACT

The invention relates to non-ozone depleting cleaning compositions for degreasing elements in manufacturing and engineering processes like oily machine parts and for defluxing printed circuit boards, used in the electric and electrical industry. The composition according to the invention contains at least one $C_{6-12}$ alkyllactate ester, preferably 2-ethyl hexyl lactate, in an amount of 70–99% by weight and at least one emulsifier, preferably n-octanol, in an amount of 1–30% by weight. One of the main advantages of the present cleaning composition is based on the fact that in the rinsing step with water for removing the cleaning composition from the treated surface an emulsion is formed, which on the one hand is stable enough for having proper rinsing ability and on the other hand—after the rinsing step—will separate rather quickly into an oil and a water phase. This last mentioned phenomenon provides the benefits of reusing the active cleaning agent, i.e. the $C_{6-12}$ alkyllactate ester and reusing and/or partly discarding the waste water being toxicologically and environmentally safe.

7 Claims, No Drawings

NON-OZONE DEPLETING CLEANING COMPOSITION FOR DEGREASING AND DEFLUXING PURPOSES

TITLE OF THE INVENTION

1. Field of the Invention

The invention relates to non-ozone depleting cleaning compositions for the removal of grease or oil from elements in the manufacturing and engineering processes like oily machine parts and for defluxing of printed circuit boards within the assembly process.

2. Background of the Invention

Traditionally either ozone depleting or toxic cleaners are used which application is increasingly restricted due to their environmental impact. The Montreal protocol of the year 1989 covers the phase out of ozone depleting chemicals such as Freon solvents e.g. CFC 113 and chlorine type solvents e.g. 1,1,1-trichloroethane. For toxicity reasons also methylene chloride and trichloroethylene are being replaced. As a result of these phase out schedules the industry is searching for alternative cleaners and cleaning procedures.

As background information, one may point to Japanese application 2-176176 having a filing date of Jul. 5, 1990. More particularly this Japanese application is directed to a cleaning composition as substitute for Freons and chlorine type solvents, which composition contains as essential ingredients a non-ionic surfactant and one or more 1-monocarboxylic acid esters having the formula $R_1$-COO-$R_2$, wherein $R_1$ represents an alkyl group having 1–6 carbon atoms and $R_2$ represents an alkyl group having 1–10 carbon atoms with the proviso that the sum of the carbon atoms of the symbols $R_1$ and $R_2$ is at least 7.

The concentration of the non-ionic surfactant, used in the prior aft cleaning composition is in the range of 1–30% by weight. Examples of the surfactants are the polyoxyethylene compounds such as the polyoxyethylene alkylethers etc.

Examples of the monocarboxylic acid esters being used in the range of 50–99% of the cleaning compositions are sec-hexyl acetate, 2-ethylhexyl acetate, isopentyl propionate, butyl butyrate and isopentyl isobutyrate.

Also various stabilizers and additives like hydrocarbons, alcohols, ethers, esters, acetals, ketones, fatty acids, nitroalkanes, amines, amides, glycols, aminoethanols and benzotriazoles can be added to the cleaning compositions in order to preserve the stability of the liquid, raise the stability in relation to the object to be cleaned or raise the dissolving capacity of the composition. Further also anionic surfactants can be added to these prior art compositions.

It is stated in Japanese application 2-176176 that the compositions in question would have a good finish and a high degreasing capacity which matches those of prior cleaners for this purpose like Freons and chlorine type solvents. However, nothing is mentioned abut the reuse possibilities of the active cleaning agent in the cleaning composition as under the heading "Benefits of the invention" there is merely talk of the high biodegradability of the cleaning compositions by environmental microorganisms.

Following up the above, there is disclosed rather complicated cleaning compositions in embodiments 1–5 tabulated in Table 4 of Japanese Application 2-176176, which compositions comprise at least five components.

In Japanese patent application 1-172051 filed on Jul. 5, 1989 a cleaning agent for defluxing printed circuit boards is disclosed, which is characterized by the presence of an alkyl lactate ester as its main component. Examples of such alkyl lactate esters, which are advantageously used, are methyl lactate, isopropyl lactate, butyl lactate and most preferably ethyl lactate. Although the cleaning agent may be formed by only the above-mentioned alkyl lactate esters or mixtures thereof the alkyl lactate ester may also be mixed (up to 10%) with well-known solvents such as water, methanol, ethanol, isopropanol, nitromethane, nitroethane and N-methyl-2-pyrrolidone etc. Therefore no mention is made of the possible use of compounds having a specific activity like an emulsifier as a component of the cleaning agent according to Japanese patent application 1-172051. Further, no indication whatsoever is given for reusing the active cleaning compound after the cleaning stage of the printed circuit boards which would result in a better economy of the cleaning process and a smaller impact on the environment on account of the discard of a minimal amount of effluent of the process.

SUMMARY OF THE INVENTION

In view of the above, Applicant has searched for alternatives, which (a) have an excellent cleaning ability in the above-mentioned field of degreasing and defluxing, (b) are non-ozone depleting and toxicologically and environmentally safe and (c) provide a cleaning process having a minimal impact on the environment.

Surprisingly it has been found by Applicant that a cleaning composition, comprising at least one $C_{6-12}$ alkyl lactate ester as the main component and at least one emulsifier as the minor component do meet the above-mentioned requirements.

More particularly it is brought to the fore that contaminated surfaces such as greasy or oily surfaces or printed circuit boards are treated with the cleaning composition according to the invention by means of immersion or spraying. This cleaning step may be supported by either heat or ultrasound. Subsequently, the treated surfaces are rinsed with water to remove the cleaner from the surfaces. Due to the composition of the present cleaning composition, an emulsion is formed on water rinsing, which is stable enough to have a proper rinsing ability. As is generally known the cleaning performance is adversely affected by a poor rinsability of the cleaning composition.

Further to the above indicated advantage of the cleaning composition according to the invention, i.e. the good rinsing ability with water, the emulsion collected after the rinsing step will easily and quickly separate into an oil and water phase, which are both easy to reuse. Therefore, a second advantage of the cleaning composition according to the invention lies in the reuse-possibilities of the $C_{6-12}$ alkyl lactate ester as the main cleaning agent and the waste-water, which may partly be discarded from the cleaning process. In summary it is emphasized that by adjusting the composition of the invention to the polluted objects to be treated an optimum is created between (a) a proper water rinsability or cleanliness of the treated surface and (b) the reuse possibilities of both the cleaning agent, i.e. the $C_{6-12}$ alkyl lactate ester, the emulsifier and the waste-water, resulting in a reduction of both cleaner consumption, waste- water volume and pollution of the environment.

Concerning the emulsion to be formed after rinsing the surface treated with cleaning composition with water it is brought to the fore that the stability of the emulsion should only be stable enough for achieving a proper rinsing stability, i.e. the emulsion obtained after the rinsing step should break into an oil and water phase as quickly as possible. The shorter the breaking time, the sooner the cleaning agent, i.e. the $C_{6-12}$ alkyl lactate ester and a part of the obtained waste-water can be recycled to the cleaning step.

Examples of $C_{6-12}$ alkyl lactate esters, that can be used for degreasing greasy or oily elements or for defluxing printed circuit boards are n-hexyl lactate, octyl lactate, nonyl lactate, decyl lactate and preferably 2-ethylhexyl lactate.

With regard to the emulsifier it is preferably a non-ionic surfactant. Examples of non-ionic surfactants include polyoxyethylene derivatives such as polyoxyethylene alkyl ethers like polyoxyethylene lauryl ethers, polyoxyethylene cetyl ethers, polyoxyethylene stearyl ethers and polyoxyethylene oleyl ethers, etc., polyoxypropylene ethers, polyoxyethylene alkylphenyl ethers like polyoxyethylene nonylphenyl ethers and polyoxyethylene octylphenyl ethers, etc., polyoxyethylene/polyoxypropylene block copolymers, polyoxyethylene sorbitan fatty acid esters, polyoxyethylene fatty acid esters, polyoxyethylene alkyl amines and polyoxyethylene fatty acid amides, etc., polyoxypropylene ethers, sorbitan fatty acid esters and glycerol fatty acid esters, etc. These surfactants can be used singly or in a combination of two or more. The number of added molecules in the ethylene oxide part of the polyoxyethylene type non-ionic surfactant is advantageously 3–40.

The preferred emulsifiers are alkanols having 6–12 carbon atoms. The most preferred alkanol is n-octanol.

With regard to the components of the composition of the invention it is remarked that the $C_{6-12}$ alkyl lactate ester is advantageously present in an amount of 70–99% by weight and the emulsifier in an amount of 1–30% by weight, based on the whole composition.

DETAILED DESCRIPTION OF THE INVENTION

The invention is illustrated with the help of a number of examples; the indicated percentages are percentages by weight, calculated on the whole composition.

EXAMPLE 1

This example relates to degreasing tests with flat carbon steel coupons (size: 50×20 ram) loaded by a roller with 75 μm of a press forming oil (Firm: BP) and baked at 120° C. for 18 hours. The obtained contaminated carbon steel coupons were cleaned at room temperature by immersion of said coupons in the cleaning liquid shown in Table A present in a glass beaker and circulation of the liquid through oscillation of the beakerglas at a frequency of 90/min. and an amplitude of 4.5 cm. The immersion time is 30 sec. The immersion cleaning is followed by spray rinsing with water for 30 sec. with a mobile oscillating spray head at a spray pressure of 0.5 bar.

The cleanliness-level of the surface of the coupons after cleaning is measured through ATR-FTIR (Attenuated Total Reflection-Fourier Transform InfraRed spectroscopy). More particularly the above FTIR-method relates to a method according to which the contamination left on the surface of the objects after cleaning is determined by reflection mode Fourier Transform Infrared spectroscopy. The spectra are collected on the metal surfaces directly. The cleanliness level of the surface is characterized by the area under the spectral lines in the wavelength-range of 2700–3000 $cm^{-1}$.

TABLE A

| Tests | Lactate ester | Emulsifier | FTIR |
| --- | --- | --- | --- |
| 1 | 2-Ethylhexyl lactate | 3% Tween 20* | 0.04 |

TABLE A-continued

| Tests | Lactate ester | Emulsifier | FTIR |
| --- | --- | --- | --- |
| 2 | 2-Ethylhexyl lactate | 2% octanol | 0.09 |
| 3 | Hexyl lactate | 3% Tween 20 | 0.17 |
| 4 | Octyl lactate | 3% Tween 20 | 0.16 |
| 5 (comparative) | Ethyl lactate | none | 0.40 |
| 6 (comparative) | 2-Ethylhexyl lactate | none | 0.55 |
| 7 (comparative) | Water | none | 13.84 |

*Tween 20: ethoxylated sorbitan monoester (Firm: ICI)

EXAMPLE 2

Contaminated carbon steel coupons obtained according to Example 1 are treated with the cleaning liquids shown in Table B in the way as indicated in Example 1.

The emulsification properties of the several emulsifiers are evaluated through measurement of the turbidity with a dispersion analyzer (type PDA 2000). In particular, the cleaning liquid (5%) and water are mixed with a rotor. The emulsion thus formed is pumped through a dispersion analyzer (PDA 2000) to measure "the turbidity" of the emulsion. With an efficient emulsifier, a large number of small cleaner droplets are dispersed in the water increasing the turbidity. The water rinsing properties are directly related to the turbidity of the emulsion.

The emulsion stability is classified in a scale from 1 to 5, wherein 1 represents an emulsion which is stable for a few days and 5 represents immediate separation of the emulsion.

The optimum is represented by a number 5 stability, combined with a high turbidity and a very low FTIR.

TABLE B

| Tests | Lactate ester | Emulsifier | FTIR | Turbidity | Stability |
| --- | --- | --- | --- | --- | --- |
| 8 | 2-Ethylhexyl lactate | 3% Berol* 07 | 0.06 | 42.5 | 3 |
| 9 | 2-Ethylhexyl lactate | 3% Na oleate | 0.22 | 22 | 4 |
| 10 | 2-Ethylhexyl lactate | 3% PEG** 10000 | | 5 | 5 |
| 11 | 2-Ethylhexyl lactate | 3% Octanol | 0.06 | | 5 |

*Berol 07: ethoxylated alcohol (Firm: Berol Nobel)
**PEG: polyethylene glycol

EXAMPLE 3

A further series of tests are described to demonstrate the defluxing ability of the cleaning composition of the present invention. Test FR-4 laminate testboards are used, assembled with two 68-terminal 50 mil pitch J-leaded plastic chip carriers (PLCC68) and 12 chip capacitors type 2220 (CC2220). The chosen components are very to extremely difficult to clean due to their size and stand-off height. A Kester Rheomat 229 paste (Firm: Kester) is applied in a reflow soldering process.

The cleaning procedure with the cleaning liquids shown in Table C is performed at 60° C. for 2 minutes after which the boards are rinsed first with tap water and secondly with deionized water. The drying process is a two-stage process i.e. the boards are first dried with pressurized nitrogen gas and then heated at 80° C. for 2 minutes.

Cleanliness is evaluated through a "Protonique MCM-1 contamination test" of the ionic residues. More particularly, the cleanliness level of the production boards is measured by a protonique unit. The remaining contamination after cleaning is expected to dissolve in a water/IPA mixture. Then the dissolved contamination is measured through conductivity and expressed in µg equivalent $NaCl/cm^2$ (see Table C). Visual inspection is carried out and results are ranked from 1 (completely clean) to 5 (very contaminated) and shown in Table C.

TABLE C

| Tests | Ionic residues µg eq. $NaCl/cm^3$ | | Visual inspection | |
|---|---|---|---|---|
|  | CC2220 | PLC68 | CC2220 | PLC68 |
| Reference* | 0.288 | 0.425 | 5 | 5 |
| 2-Ethylhexyl lactate + 3% Tween 20 | 0.095 | 0.032 | 4 | 2 |
| 2-Ethylhexyl lactate + 3% Octanol | 0.050 | 0.025 | 1 | 1 |

*Reference is non-treated and on-cleaned.

We claim:

1. A non-ozone depleting cleaning composition consisting of
   a. 70–99% by weight, based on the whole composition of at least one $C_{8-12}$ alkyl lactate ester, and
   b. 30–1% by weight, based on the whole composition, of at least one emulsifier, selected from the group consisting of polyoxyethylene alkyl ethers; polyoxypropylene ethers; polyoxyethylene alkylphenyl ethers; polyoxyethylene/polyoxypropylene block copolymers; polyoxyethylene sorbitan fatty acid esters; polyoxyethylene fatty acid esters; polyoxyethylene alkyl amides; polyoxyethylene fatty acid amides; polyoxypropylene ethers; sorbitan fatty acid esters; glycerol fatty acid esters; and alkanols having 6–12 carbon atoms.

2. The composition according to claim 1, wherein said $C_{8-12}$ alkyl lactate ester is 2-ethylhexyl lactate.

3. The composition according to claim 1, wherein said emulsifier is an alkanol having 6–12 carbon atoms.

4. The composition according to claim 3, wherein said emulsifier is n-octanol.

5. The composition according to claim 1, wherein said $C_{8-12}$ alkyl lactate ester is 2-ethylhexyl lactate and said emulsifier is n-octanol.

6. The composition according to claim 1, wherein the polyoxyethylene alkyl ethers are selected from the group consisting of polyoxyethylene alkyl lauryl ethers, polyoxyethylene cetyl ethers, polyoxyethylene stearyl ethers and polyoxyethylene oleyl ethers.

7. The composition according to claim 1, wherein the polyoxyethylene alkyl phenyl ethers are selected from the group consisting of polyoxyethylene nonylphenyl ethers and polyoxyethylene octylphenyl ethers.

* * * * *